(12) United States Patent
Wang

(10) Patent No.: US 8,399,873 B2
(45) Date of Patent: Mar. 19, 2013

(54) ROTATABLE WATERPROOF SENSING DEVICE

(75) Inventor: Chu-Li Wang, Taipei (TW)

(73) Assignee: Emcom Technology Inc., Taipei (TW)

( * ) Notice: Subject to any disclaimer, the term of this patent is extended or adjusted under 35 U.S.C. 154(b) by 433 days.

(21) Appl. No.: 12/788,138

(22) Filed: May 26, 2010

(65) Prior Publication Data

US 2011/0132086 A1 Jun. 9, 2011

(30) Foreign Application Priority Data

Dec. 9, 2009 (CN) ...................... 2009 2 0273198 U

(51) Int. Cl.
*G01N 15/06* (2006.01)
*G01N 21/49* (2006.01)
*G01N 21/85* (2006.01)

(52) U.S. Cl. ......... 250/573; 250/208.1; 348/81; 396/25; 396/29

(58) Field of Classification Search ............... 250/208.1, 250/214.1, 214 R, 573; 340/555–557; 348/81–83, 348/281, 282, 302, 373, 376; 396/25–29
See application file for complete search history.

(56) References Cited

U.S. PATENT DOCUMENTS

| | | | | |
|---|---|---|---|---|
| 3,141,397 A | * | 7/1964 | McNeil | 396/24 |
| 5,659,804 A | * | 8/1997 | Keller | 396/20 |
| 6,507,700 B1 | * | 1/2003 | Takekuma et al. | 396/25 |
| 2006/0072020 A1 | * | 4/2006 | McCutchen | 348/218.1 |

* cited by examiner

*Primary Examiner* — Francis M Legasse, Jr.
(74) *Attorney, Agent, or Firm* — Cheng-Ju Chiang

(57) ABSTRACT

A waterproof sensing device including a base, a rear cover, a sensing module, and a lens is provided. The rear cover is selectively rotatably disposed on the base, wherein the rear cover has a side wall to enclose an accommodation space. The sensing module is disposed in the accommodation space. The lens covers the rear cover on the edge of the side wall of the rear cover and seals the accommodation space. A waterproof treatment is disposed between the lens and the edge of the side wall, such that moisture is prevented from intruding into the accommodation space to cause damage, no matter where the sensing device is disposed.

13 Claims, 6 Drawing Sheets

ROTATABLE WATERPROOF SENSING DEVICE

CROSS REFERENCE TO RELATED APPLICATIONS

This application claims priority based on a China patent application No. 200920273198.5 filed on Dec. 9, 2009, the disclosure of which is incorporated herein by reference in its entirety.

BACKGROUND OF THE INVENTION

1. Field of the Invention

The present invention relates to a sensing device, and more particularly, to a waterproof sensing device for a light fixture.

2. Description of the Prior Art

Nowadays sensor-based light fixtures are widely applied to office buildings, business premises, residences, communities, and other public places, and more particularly, to the corridors, stairways, arcades, and other dark areas in need of lighting. By illuminating whenever a motion is detected, the sensor-based light fixture effectively deters potential burglars or thieves at night time and provides enough illumination to surveillance equipments for photographing.

FIG. 1 illustrates a schematic perspective view of a conventional sensor-based light fixture. The sensor-based light fixtures includes a rear casing 10, a first circuit board 12, a second circuit board 14, a frame 15, a lens 18, and a front cover 20. The front cover 20 has a light-output portion 22, which can be an opening. The light source (not illustrated) is automatically activated by detecting ambient light and moving object via the light-output portion 22. The first circuit board 12, the second circuit board 14, the frame 15, and the lens 18 are enclosed by the rear casing 10 and the front cover 20. Electronic components (not illustrated) can be mounted on the first circuit board 12 and the second circuit board 14 to facilitate the operation of the light source. The lens 18 is disposed on the frame 15 and then attached to the inner wall of the front cover 20, i.e., close to the periphery of the light-output portion 22.

In such a case, the edge of the frame 15 compels the lens 18 to be screwed to the front cover 20 around the light-output portion 22 and covers the light-output portion 22 so that the perimeter of the light-output portion 22 is defined. However, with such arrangements, rain drop or moisture is likely to penetrate through the gap between the light-output portion 22 and the lens 18 as well as the joint between the front cover 20 and the rear casing 10. Consequently, the electronic components mounted on the circuit boards 12 and 14 or the light source may be short-circuited or damaged. One approach to address the above problem is to apply seal rings, waterproof adhesives, or other waterproof treatments to the gap or joint of such a structure and the cost is accordingly increased.

Therefore, a waterproof structure for light fixture is highly desired.

SUMMARY OF THE INVENTION

It is an objective of the present invention to provide a waterproof sensing device with one time waterproof treatment.

It is another objective of the present invention to provide a waterproof sensing device at low cost.

It is another objective of the present invention to provide a waterproof sensing device having enhanced durability.

It is another objective of the present invention to provide a waterproof sensing device suitable for outdoor and indoor use.

It is yet another objective of the present invention to provide a multi-directional adjustable sensing device.

A waterproof sensing device of the present invention includes a base, a rear cover, a sensing module, and a lens. The rear cover is selectively rotatably disposed on the base, wherein the rear cover has a side wall to enclose an accommodation space. The sensing module is disposed in the accommodation space. The lens covers the rear cover on the edge of the side wall of the rear cover and seals the accommodation space. A waterproof treatment is provided between the lens and the edge of the side wall, such that moisture is prevented from intruding into the accommodation space to cause damage, no matter where the sensing device is disposed.

In a preferred embodiment, the waterproof sensing device further includes a front cover partially covering the lens. The front cover is formed with a sensing opening to expose the lens. The sensing module receives a sensing signal via the lens and the sensing opening. A gap exists between the front cover and the lens, such that the shape of the inner surface of the front cover can be different from the shape of the outer surface of the lens. The edge of the side wall of the rear cover has a recess, and the lens corresponding to the edge of the side wall has a flange for engaging with the recess. The waterproof treatment can include a seal ring disposed between the recess and the flange. The rear cover further includes a plurality of first assembling holes, and the lens has a plurality of second assembling holes corresponding to the plurality of the first assembling holes. The front cover includes a plurality of positioning pillars, so that a plurality of fixing elements can pass through the first assembling holes and the second assembling holes to be positioned on the positioning pillars.

In addiction, the waterproof treatment can include other waterproof materials, hot-melt technology, or the combinations thereof. The waterproof material can include a seal ring, adhesives, or other suitable materials capable of providing waterproof effective. The hot-melt technology can include an ultrasonic hot-melt technology, a dual-material injection molding technology, or other appropriate technologies.

DETAILED DESCRIPTION OF THE PREFERRED EMBODIMENT

The present invention provides a waterproof sensing device with one-time waterproof treatment. That is the waterproof treatment can be applied only once to the sensing device. In an embodiment, the sensing method of the sensing device is preferably a passive infrared sensor (PIR). In other embodiments, however, the present invention may be used with other wireless sensing devices such as temperature sensing device, voice sensing device, etc. for the auto-sensing applications such as automatic door, touch switch, etc. In addition, the abovementioned waterproof sensing device is preferably applied to night lighting systems or other sensor-based light fixtures, wherein the light source thereof may include light emitting diode (LED), fluorescent lamp, halogen lamp, tungsten lamp, or other energy-saving lamps. In order to illustrate the present invention, various embodiments and structures thereof are described below with reference to the accompanied drawings.

Figure 1:
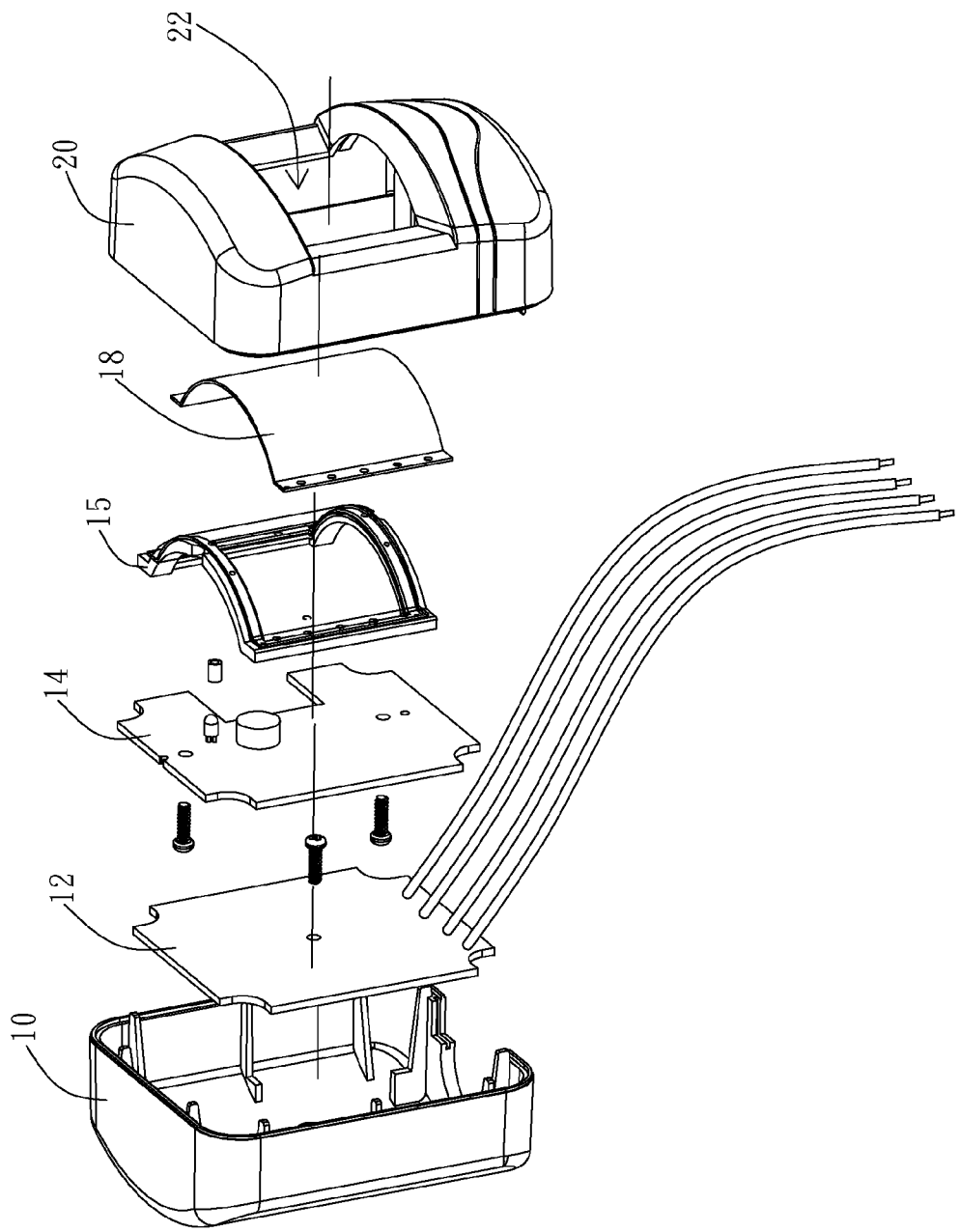
FIG. 1 is a perspective view of a conventional sensor-based light fixture.
Figure 2:
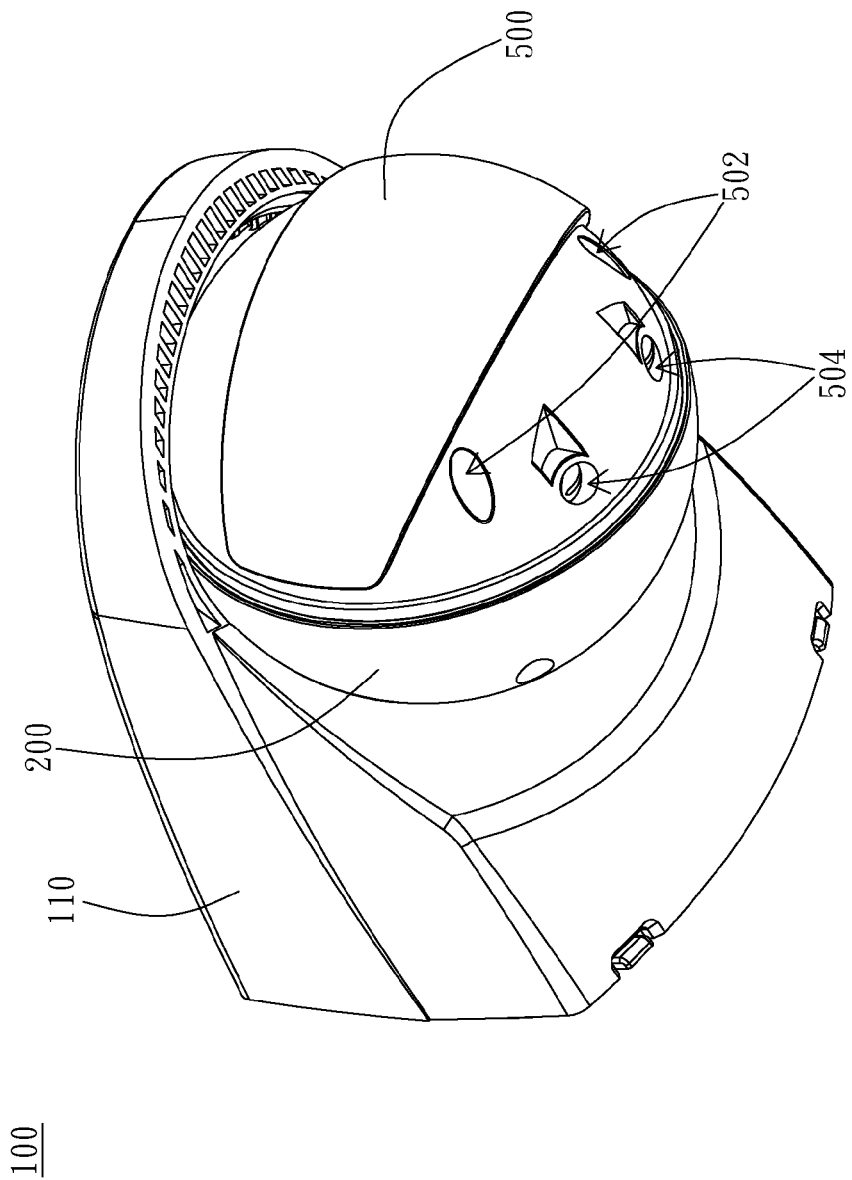
FIG. 2 illustrates an embodiment of a waterproof sensing device according to the present invention.
Figure 3A:
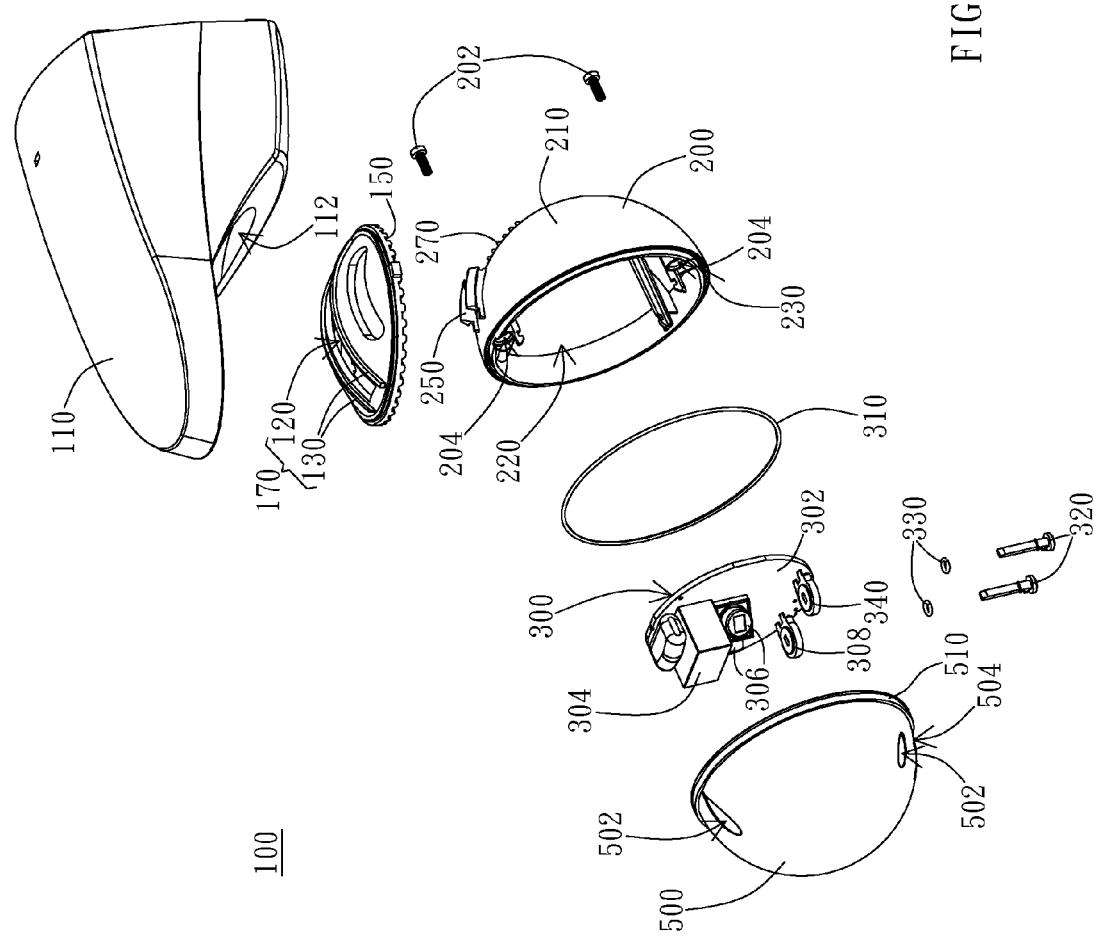
FIG. 3A illustrates an exploded view of the waterproof sensing device of the present invention.

As FIG. 2 and FIG. 3A show, a waterproof sensing device 100 of the present invention includes a base 110, a rear cover 200, a sensing module 300, and a lens 500. The rear cover 200 is selectively rotatably disposed on the base 110, wherein the rear cover 200 has a side wall 210 to enclose an accommodation space 220. In the embodiment shown in FIG. 3A, the rear cover 200 is assembled in a base hole 112 of the base 110 by utilizing a rotatable supporter 170. The upper end of the side wall 210 of the rear cover 200 has a set of engaging portions 250 and a rack 270 (only partially illustrated) disposed along the direction of the engaging portions 250. As shown in FIG. 3A, the engaging portions 250 can be a pair of hooks. The engaging portions 250 can be movably connected to the rotatable supporter 170 so that the rear cover 200 can move upwards and downwards (or alternatively forward and rearward) with the help of the rack 270. The rotatable supporter 170 further has a pair of arc protrusions 130 and an arc recess 120 due to the curve exterior appearance. As shown in FIG. 3A, the arc recess 120 is disposed between the pair of arc protrusions 130 to receive the engaging portions 250 and allow the engaging portions 250 to be engaged with the upper portions of the arc protrusions 130, respectively. Moreover, the rotatable supporter 170 is preferably an arc-shaped housing. The rim of the arc-shaped housing further has a plurality of the teeth 150. The base 110 has a plurality of engaging portions (not illustrated) disposed corresponding to the teeth 150 and engaged therewith, such that the rear cover 200 can be rotated leftward or rightward (or alternatively clockwise or counterclockwise) with respect to the base 110. In other words, by means of the rotatable supporter 170, the rear cover 200 is multi-directionally adjustable to rotate forward, rearward, leftward, or rightward to a desired position.

Figure 5:
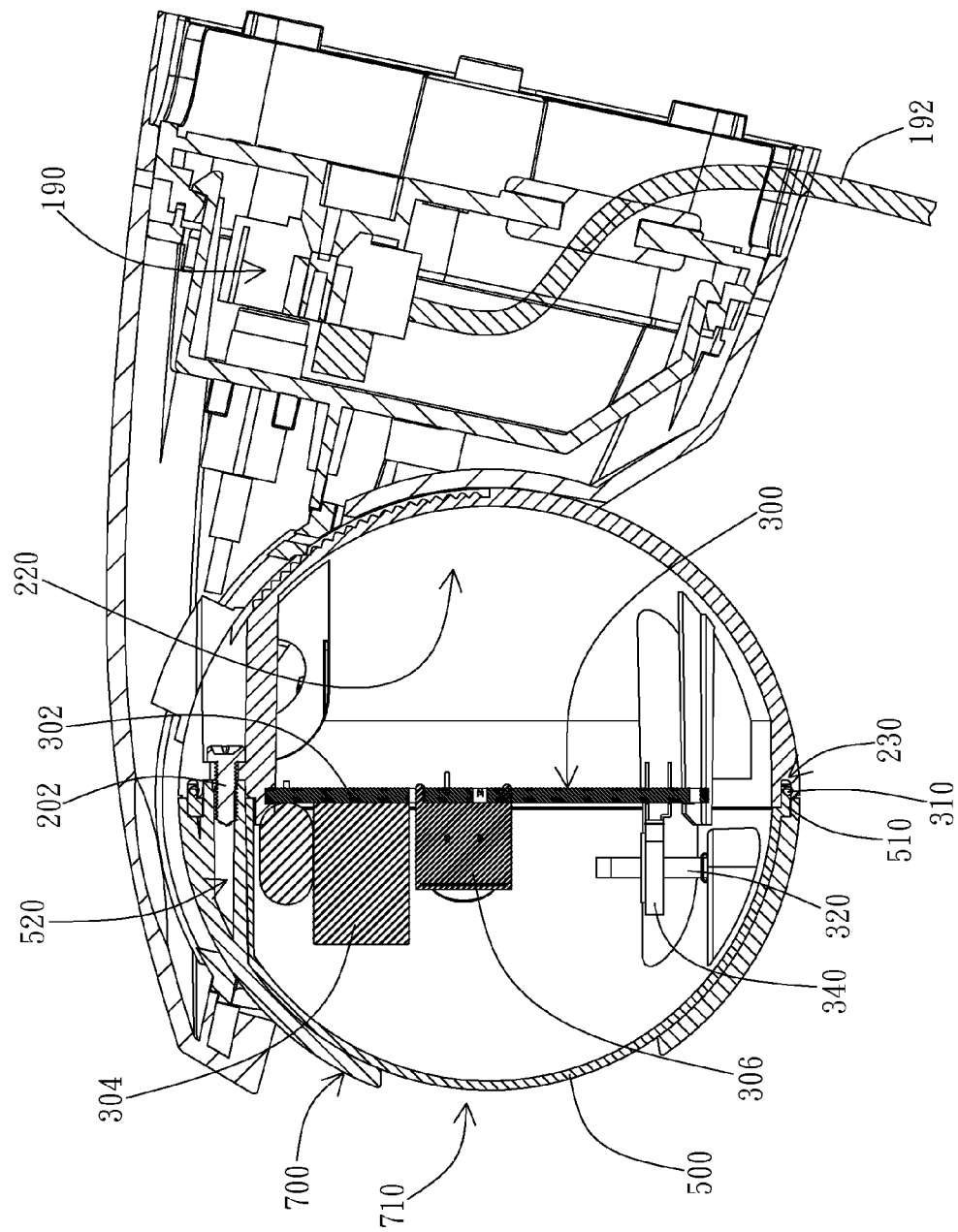
FIG. 5 illustrates a cross-sectional view of the waterproof sensing device of the present invention.

Please also refer to FIG. 5; the sensing module 300 is enclosed in the accommodation space 220. The sensing module 300 directly receives a sensing signal through the lens 500. The lens 500 covers the rear cover 200 on the edge of the side wall 210 of the rear cover 200 and seals the accommodation space 220. The edge of the side wall 210 of the rear cover 200 further has a recess 230, and the lens 500 corresponding to the edge of the side wall 210 has a flange 510 to engage with the recess 230. In the embodiment shown in FIGS. 3A and 5, a seal ring 310 is further disposed between the recess 230 and the flange 510 to prevent moisture from entering into the accommodation space 220. In the embodiment, the seal ring 310 can be considered as a waterproof treatment. In other embodiments, however, instead of the seal ring 310, waterproof glue, adhesive material, or other materials for preventing moisture from entering the accommodation space 220 can be implemented.

In addition, as FIG. 3A shows, the rear cover 200 further has at least one fixing element 202 and at least one first assembling hole 204. The lens 500 has at least one second assembling hole 502 corresponding to the first assembling hole 204. The fixing element 202 passes through the first assembling hole 204 from the rear side of the side wall 210 and then engages with the second assembling hole 502 of the lens 500. In this embodiment, the fixing element 202 is preferably a screw or a bolt, and the number of the fixing element 202, the first assembling hole 204, and the second assembling hole 502 is preferably respectively three. However, in the embodiment shown in FIG. 3B, the number of the aforesaid elements may be two or other numbers depending on the demand. Furthermore, since the lens 500 is formed with several second assemble holes 502, the fixing element 202 is preferably implemented in conjunction with a seal ring or other waterproof materials (not illustrated) to prevent moistures from entering into the device.

Figure 3B:
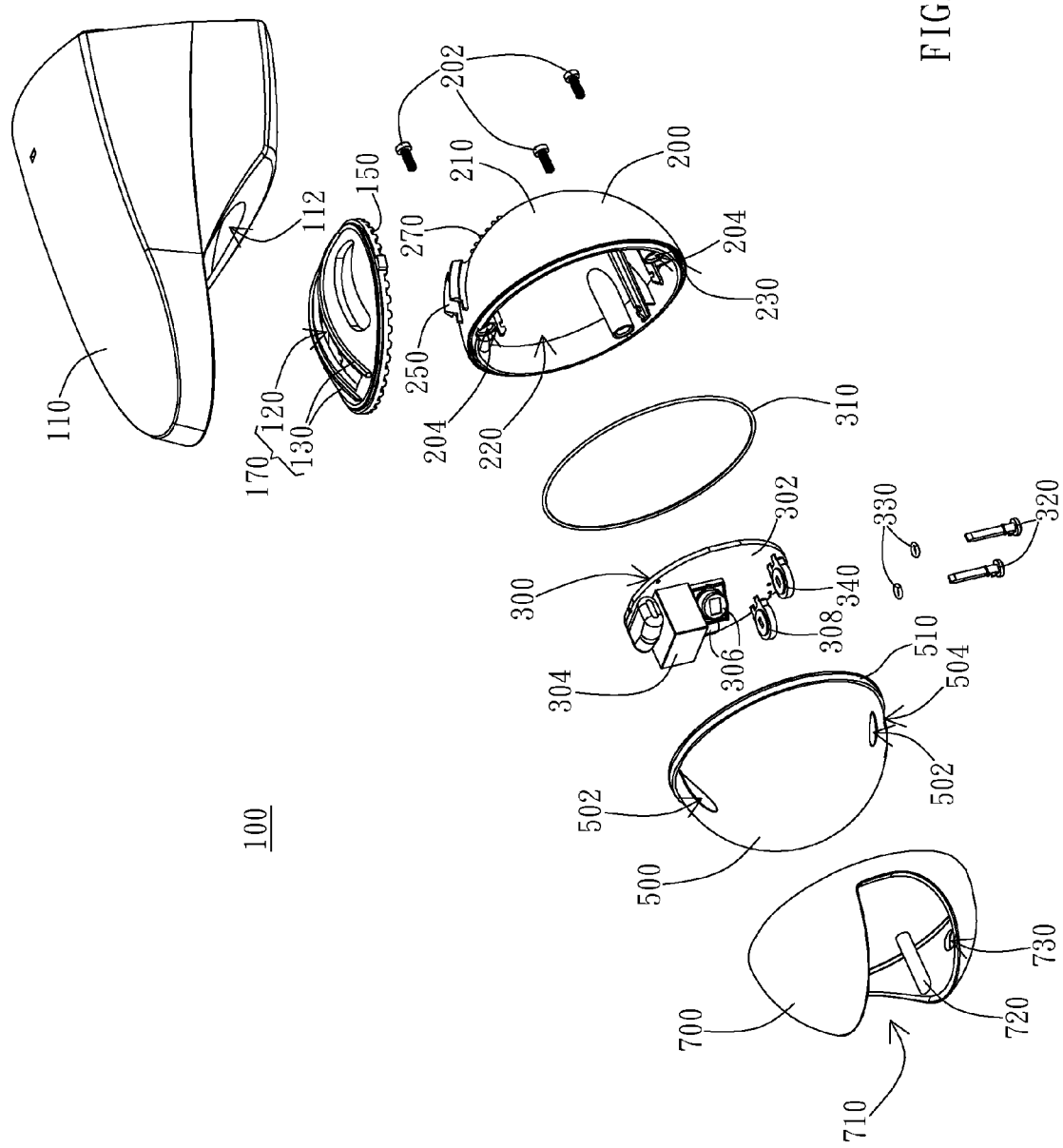
FIG. 3B illustrates an exploded view of the waterproof sensing device of another embodiment of the present invention.

As FIG. 3A and FIG. 3B show, the sensing module 300 includes a printed circuit board 302 and various components such as sensor 306, switch controller 304, timer 340, light sensor 308, and a plurality of electronic components (i.e. resistances and inductances, etc., not shown) which are mounted on the printed circuit board 302. In the embodiment, the sensor 306 is preferably a passive infrared (PIR) sensor. In other embodiment, however, the sensor 306 can be a PIR sensor used with temperature sensor, voice sensor, or other wireless sensors. The switch controller 304 includes relay, light relay, thermal relay, electronic relay, or other suitable switch controller. The light sensor 308 can detect whether ambient illumination exceeds a predetermined illumination. In one embodiment, the light sensor 308 is required when the present invention is applied to the night lighting system or other types of lamps. In another embodiment, the light sensor 308 can be omitted when the present invention is applied to other devices instead of lamps. The timer 340 is configured to control the operation or activation time period based on the target/element to be controlled. In other words, when the sensing module 300 is configured to control a lamp device, the timer 340 controls the lighting time period of the lamp device. When the sensing module 340 is applied to an automatic door, the timer 340 can be configured to control the open time period of the automatic door.

In addiction, the sensing module 300 further includes a set of adjustment elements 320 for adjusting a given illumination value of the light sensor 208 and a time period of the timer 340, respectively. In one embodiment, the lens 500 can have a plurality of holes 504 corresponding to the light sensor 208 and the adjusting element 320, such that the adjustment elements 320 can pass through the holes 504 and connect to the light sensor 308 and the timer 340, respectively. Moreover, in order to prevent moistures from entering into the device through the holes 504, the adjustment elements 320 can be implemented in conjunction with the seal rings 330 and then assembled in the holes 504. Referring to FIG. 5, the base 110 further includes a wiring box 190 having a plurality of power wires 192 for connecting to the sensing module 300 to provide electric power.

It is noted that the lens 500 of the present embodiment is a transparent housing with greater surface area and bigger size to define a larger accommodation space. In another embodiment, the shape and size of the lens 500 can be similar to or smaller than the shape and size of the rear cover 200. By applying the waterproof treatment between the lens 500 and the rear cover 200, the sensing device can achieve a great waterproof effective.

Figure 4:
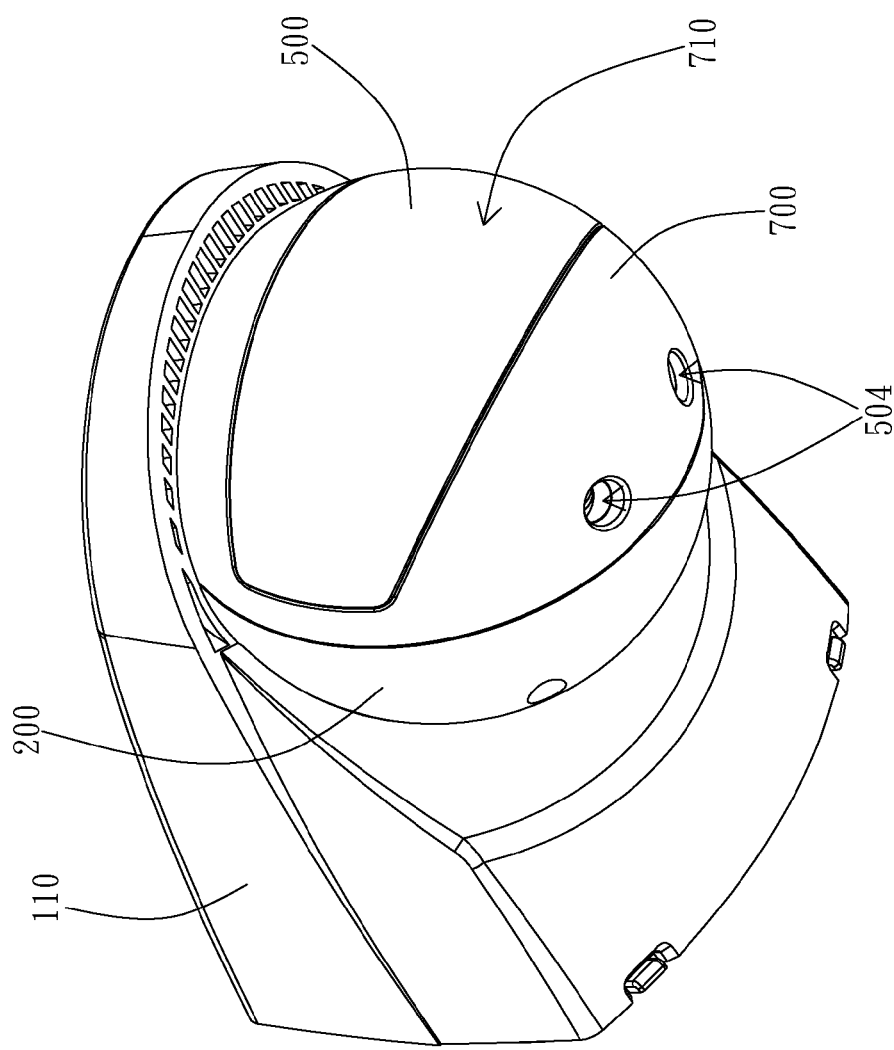
FIG. 4 is an assembly view of FIG. 3B.

As FIGS. 3B, 4, and 5 show, the waterproof sensing device 100 further includes a front cover 700 partially covering the lens 500. That is, the front cover 700 is formed with a sensing opening 710 to expose the lens 500. The sensing module 300 receives a sensing signal via the lens 500 and the sensing opening 710. In the embodiment shown in FIG. 3B and FIG. 4, the shape of the front cover 700 and the lens 500 are both preferably a curve shape. In other embodiments, however, the shape of the front cover 700 or the lens 500 can be a rectangular or a predetermined geometric shape. In order words, a gap may exist between the front cover 700 and the lens 500 to allow the shape of the inner surface of the front cover 700 to be different from the shape of the outer surface of the lens 500, so that the shape of the front cover 700 can be different from the shape of the lens 500.

In this embodiment, the front cover 700 further includes at least one positioning pillar 720. The fixing element 202 passing through the first assembling hole 204 and the second assembling hole 502 can be engaged with the positioning pillar 720, such that the front cover 700 and the lens 500 are assembled with the rear cover 200. The front cover 700 further has an additional hole 730 corresponding to the hole 504 of the lens 500. The adjustment elements 320 can pass through the additional holes 730 and the holes 504 to connect to the light sensor 308 and the timer 340 of the sensing module 300 when the front cover 700 is assembled with the lens 500. Therefore, by applying the waterproof treatment between the lens 500 and the edge of the sidewall 210 of the rear cover 200, the sensing device 100 can achieve a great waterproof effective which is less likely to cause damage no matter disposed outdoors or indoors. In addiction, although the waterproof treatment of the embodiment includes the seal ring 300, in other embodiments, the waterproof treatment can include hot-melt adhesives, Epoxy resins, or other adhesives using hot-melt technology. The hot-melt technology includes an ultrasonic hot-melt technology, a dual-material injection molding technology, or other appropriate technologies.

Although the preferred embodiments of the present invention have been described herein, the above description is merely illustrative. Further modifications of the invention herein disclosed will occur to those skilled in the respective arts and all such modifications are deemed to be within the scope of the invention as defined by the appended claims.

What is claimed is:

1. A waterproof sensing device, comprising:
a base;
a rear cover having a set of engaging portions, at least one fixing element and at least one first assembling hole and selectively rotatably disposed on the base, wherein the rear cover has a side wall to enclose an accommodation space;
a sensing module disposed in the accommodation space;
a lens covering the rear cover on an edge of the side wall of the rear cover and sealing the accommodation space, wherein a waterproof treatment is provided between the lens and the edge of the side wall, and wherein the lens has at least one second assembling hole corresponding to the first assembling hole, the fixing element passes through the first assembling hole from the rear side of the side wall and then engages with the second assembling hole of the lens; and
a rotatable supporter disposed between the rear cover and the base, wherein the engaging portion can be movably connected to the rotatable supporter so that the rear cover can move along a first direction; the base is engaged with the rotatable supporter, such that the rear cover and the rotatable supporter can be rotated along a second direction, wherein the first direction is not the same as the second direction.

2. The waterproof sensing device of claim 1, further comprising a front cover partially covering the lens, wherein a sensing opening is formed on the front cover, the sensing module receives a sensing signal via the lens and the sensing opening.

3. The waterproof sensing device of claim 2, wherein a gap exists between the front cover and the lens, the shape of an inner surface of the front cover is different from the shape of an outer surface of the lens.

4. The waterproof sensing device of claim 1, wherein the edge of the side wall of the rear cover has a recess, and the lens corresponding to the edge of the side wall has a flange for engaging with the recess.

5. The waterproof sensing device of claim 4, wherein the waterproof treatment includes a seal ring disposed between the recess and the flange.

6. The waterproof sensing device of claim 2, wherein the front cover has at least one positioning pillar, and at least one fixing element passes through the first assembling hole and the second assembling hole to be positioned on the positioning pillar.

7. The waterproof sensing device of claim 1, wherein the waterproof treatment includes a waterproof materials, hot-melt technology, or the combinations thereof.

8. The waterproof sensing device of claim 7, wherein the waterproof material includes a seal ring or adhesive material.

9. The waterproof sensing device of claim 7, wherein the hot-melt technology includes an ultrasonic hot-melt technology or a dual-material injection molding technology.

10. The waterproof sensing device of claim 1, wherein the base further includes a wiring box having a plurality of power lines for connecting to the sensing module to provide power.

11. The waterproof sensing device of claim 1, wherein the rotatable supporter is rotatably connected to the base, wherein the rear cover is movably connected to the rotatable supporter.

12. The waterproof sensing device of claim 11, wherein the rotatable supporter includes an arc recess for receiving the engaging portion of the rear cover.

13. A waterproof sensing device, comprising:
a base;
a rear cover selectively rotatably disposed on the base, wherein the rear cover has a side wall to enclose an accommodation space;
a sensing module disposed in the accommodation space;
a lens covering the rear cover on an edge of the side wall of the rear cover and sealing the accommodation space, wherein a waterproof treatment is provided between the lens and the edge of the side wall; and
a front cover partially covering the lens;
wherein the rear cover further includes at least one first assembling hole, the lens has at least one second assembling hole corresponding to the first assembling hole, the front cover has at least one positioning pillar, and at least one fixing element passes through the first assembling hole and the second assembling hole to be positioned on the positioning pillar.

* * * * *